United States Patent [19]

Sone

[11] Patent Number: 4,716,445

[45] Date of Patent: Dec. 29, 1987

[54] HETEROJUNCTION BIPOLAR TRANSISTOR HAVING A BASE REGION OF GERMANIUM

[75] Inventor: Jun'ichi Sone, Tokyo, Japan

[73] Assignee: NEC Corporation, Tokyo, Japan

[21] Appl. No.: 4,931

[22] Filed: Jan. 20, 1987

[30] Foreign Application Priority Data

Jan. 17, 1986 [JP] Japan .................................. 61-8587

[51] Int. Cl.$^4$ .................. H01L 29/161; H01L 29/72; H01L 29/20
[52] U.S. Cl. ........................................ 357/16; 357/34; 357/61; 148/DIG. 11; 148/DIG. 58; 148/DIG. 56; 148/DIG. 67; 148/DIG. 72
[58] Field of Search ............................. 357/16, 34, 61; 148/DIG. 11, DIG. 56, DIG. 58, DIG. 59, DIG. 67, DIG. 72

[56] References Cited

U.S. PATENT DOCUMENTS

| | | | |
|---|---|---|---|
| 3,057,762 | 10/1962 | Gans | 357/16 |
| 3,275,906 | 9/1966 | Matsukura et al. | 148/DIG. 67 |
| 3,766,447 | 10/1973 | Mason | 357/16 |
| 4,119,994 | 10/1978 | Jain et al. | 357/16 |
| 4,396,931 | 8/1983 | Dumke et al. | 357/16 |
| 4,593,305 | 6/1986 | Kurata et al. | 357/16 |

FOREIGN PATENT DOCUMENTS 0159273 10/1985 European Pat. Off. .......... 357/4 SL

OTHER PUBLICATIONS

H. Kroemer, "Heterostructure Bipolar Transistors and Integrated Circuits", Proceedings of the IEEE, vol. 70, No. 1, Jan. 1982, pp. 13-25.
"OYO BUTURI", Japanese Society of Applied Physics, vol. 54, No. 11, pp. 1192-1197, 7/15/85.

*Primary Examiner*—Martin H. Edlow
*Assistant Examiner*—D. Featherstone
*Attorney, Agent, or Firm*—Sughrue, Mion, Zinn, Macpeak & Seas

[57] ABSTRACT

The heterojunction bipolar transistor has a structure of wide band-gap transistor and comprises a collector region having an N-type GaAs layer, a base region having a P-type germanium layer formed on the N-type GaAs layer, and an emitter region having an N-type semiconductor layer of mixed crystal of silicon and germanium formed on the P-type germanium layer. The mixed crystal of the N-type semiconductor layer may have a uniform distribution of silicon or a graded distribution of silicon in which a content of silicon is zero at the surface facing the P-type germanium layer and is continuously increased with distance from the surface facing the P-type germanium layer.

13 Claims, 5 Drawing Figures

HETEROJUNCTION BIPOLAR TRANSISTOR HAVING A BASE REGION OF GERMANIUM

BACKGROUND OF THE INVENTION

1. Field of the Invention

The present invention relates to a heterojunction bipolar transistor, and more particularly to a wide band-gap bipolar transistor having a base region of germanium.

2. Description of the Related Art Including Information Disclosed Under §§1.97-1.99:

The so-called wide band-gap bipolar transistor has been reported in "Proceedings of the IEEE" Vol. 70, No. 1 (January 1982) pages 13 to 23, the article "Heterostructure Bipolar Transistors and Integrated Circuits" by Herbert Kroemer. It is a heterojunction transistor having an emitter made of a semiconductor having an energy band-gap wider than the base. The injection efficiency of minority carrier from emitter to base is improved to obtain an increased current gain.

An example of the wide band-gap bipolar transistor in the prior art has been proposed in "OYO BUTURI" published by the Japanese Society of Applied Physics, Vol. 54, No. 11 pages 1192 to 1197 and has a collector composed of an N+-GaAs deposited on an insulating GaAs substrate and an N-GaAs formed on the N+-GaAs, a base composed of P+-GaAs and an emitter composed of an N-AlGaAs formed on the P-GaAs and an N+-GaAs formed on the N-AlGaAs. AlGaAs has an energy band-gap of about 1.9 eV which is wider than GaAs of 1.42 eV. Thus, an improved electron injection efficiency and an increased current gain is obtained. Electron in GaAs has a mobility of about 4,600 $cm^2/V.sec$ which is greater than Si, and has a high saturated electron drift velocity of about $1.8 \times 10^7$ cm/sec. Thus, electrons run through the base and collector regions in a very short time, resulted in a high speed operation.

On the other hand, the wide band-gap bipolar transistor in the prior-art has many drawbacks. The energy band-gap of GaAs is wider than silicon of 1.12 eV. Due to this wide band-gap, the prior art transistor requires a high voltage signal for its electrical operation and consumes a large power, compared to a silicon transistor. Moreover, GaAlAs of emitter region and N-GaAs of collector region have a difficulty in forming a low-resistive ohmic contact with a metal. In the prior-art transistor, N+-GaAs is interposed between the N-GaAlAs of emitter region and an emitter electrode of metal and between the N-GaAs of collector region and a collector electrode of metal for improving the ohmic contact property. Therefore, the device structure is complicated and causes a difficulty in manufacturing the same. Furthermore, GaAs is a semiconductor of direct transition type, while Si and Ge are an indirect transition type. Life time of minority carrier in the direct transition type semiconductor is shorter than in the indirect transition type semiconductor. Considerable part of electrons injected into the P+-GaAs base region disappear by recombination. This disappearance lowers the injection efficiency of minority carriers injected into base region. From this point of view, it is preferable to use the indirect transition type semiconductor such as Si and Ce for the base region.

For improving some of the above-explained drawbacks, it has been proposed in "Proceedings of the IEEE" Vol 70, No. 1, page 23 to use GaAs as a collector region, Ge as a base region and GaAs as an emitter region. Ge used as the base region has a low energy band-gap of 0.66 eV and a hole mobility of 4 or 5 times of GaAs or Si and is an indirect transition type semiconductor. Therefore, a low voltage drive, a low power consumption, a low base resistance and an improved injection efficiency of carrier are achieved.

However, as pointed out in "Proceedings of the IEEE" Vol. 70, No. 1, page 23, fifth paragraph of left side column, it is very hard to grow GaAs on Ge without interface defects. This GaAs-Ge-GaAs structure is not a practical resolution for the above-mentioned drawbacks. Moreover, the GaAs as the emitter region still remains the difficulty for obtaining a low-resistive ohmic contact with a metallic emitter electrode.

SUMMARY OF THE INVENTION

It is, therefore a primary object of the present invention to provide a bipolar transistor having a realizable structure and operable in high speed with a low voltage signal without consuming a large power.

It is another object of the present invention to provide a heterojunction bipolar transistor having a base region of germanium and a whole structure realizable with present manufacturing technology.

According to the present invention, there is provided a heterojunction bipolar transistor including a collector region having a GaAs layer of one conductivity type, a base region having a germanium layer of the other conductivity type formed in contact with the GaAs layer and an emitter region having a semiconductor layer of mixed crystal of silicon and germanium of the one conductivity type formed on the germanium layer. The mixed crystal semiconductor layer may have a uniform distribution of silicon in germanium or a graded distribution of silicon. In the case of the uniform distribution, the content of silicon is between 10 mol. % and 40 mol. %. In the case of the graded distribution, the content of silicon increases with distance from the interface between the base and emitter regions from 0 mol. % to a value between 10 mol. % and 40 mol. %.

The growth of germanium on GaAs and the growth of the mixed crystal layer of silicon and germanium on germanium may be performed without interface defect by use of molecular beam epitaxy. The whole structure can be easily constructed. Particularly, because the emitter is of the mixed crystal which has a lower energy band-gap of 0.8 to 0.9 eV than GaAs of 1.42 eV, a low-resistive ohmic contact with metal is easily obtained. The structure for emitter region and emitter electrode may be simplified.

The base region is made of germanium. Therefore, the bipolar transistor of the present invention is driven with a low voltage signal and consumes a small power. The injection efficiency of minority carriers is improved, due to the indirect transition in germanium. This improved injection efficiency raises the current gain. Furthermore, the germanium has a large electron mobility. The energy band-gap of the mixed crystal of silicon and germanium is about 0.77 eV and is larger than the energy band-gap of germanium which is about 0.66 eV. This fact shows the transistor of the present invention is a wide band-gap transistor. Due to the facts of large electron mobility and the wide band-gap transistor structure, the operation of the present invention is very fast.

BRIEF DESCRIPTION OF THE DRAWINGS

The above and further objects, features and advantages of the present invention will become more apparent from the following detailed description taken in conjunction with the accompanying drawings, wherein:

Referring to FIG. 1, a wide band-gap bipolar transistor in the prior art is formed on an insulating GaAs substrate 1 on which an N+-GaAs layer 2 having a high impurity density is deposited. Collector electrodes 7 of metal are formed on the N+-GaAs layer 2. An N-GaAs layer 3 is formed on the N+-GaAs layer 2. The N-GaAs layer 3 and the N+-GaAs layer 2 operate as a collector region. A P+-GaAs layer 4 having a high impurity density is formed on the N-GaAs layer 3 as a base region. Base electrode 9 of metal are formed on the P+-GaAs layer 4 with a cover of insulator film 8. N-GaAlAS layer 5 and N+-GaAs layer 6 are consecutively formed on the P+-GaAs layer 4 as an emitter region. An emitter electrode 10 of metal is formed on the N+-GaAs layer 6.

This type of wide band-gap bipolar transistor was described in "OYO BUTURI" Vol. 54, No. 11 and "Proceedings of the IEEE" Vol. 70, No. 1, as explained hereinbefore. That is, it has some drawbacks. First, because the base region is made of P+-GaAs having a large energy band-gap of 1.42 eV, the transistor requires a high voltage signal and consumes a large power. Second, although the base resistance depends on both of electron and hole mobility, only a limited decrement of the base resistance is expected by a large electron mobility and a small hole mobility of GaAs. Third, the wide energy band-gaps of GaAs and GaAlAs hardly form low-resistance ohmic contacts with metal electrode. N+-GaAs layers 2 and 6 are required for the low-resistance ohmic contacts, resulted in a complicated structure and a large number of manufacturing steps. Fourth, GaAs is a direct transition type semiconductor having a short life-time of minority carriers, resulted in a low injection efficiency and a low current gain.

Figure 1:
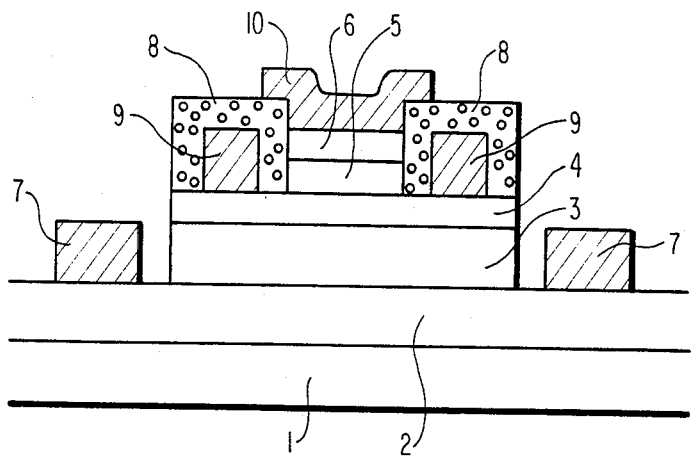
FIG. 1 is a cross sectional view of the wide band-gap transistor in the prior art.

As a measurement against the above-mentioned drawbacks, a structure having a collector of GaAs, a base of germanium and an emitter of GaAs has been proposed. This is not a practical measurement as described on page 23 of the "Proceedings of the IEEE" because it is hard to grow GaAs on germanium without interface defects. There is not any practical method for such growth. Furthermore, because the emitter region is GaAs, similarly to the transistor shown in FIG. 1. A complicated structure cannot be avoided for forming an emitter electrode on the emitter region.

DESCRIPTION OF THE PREFERRED EMBODIMENTS

Figure 2:
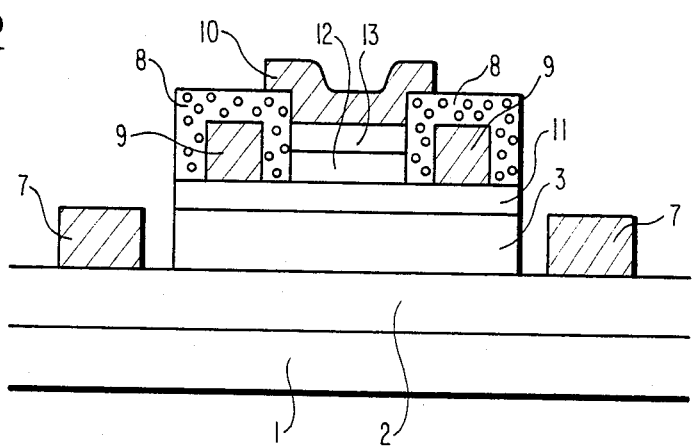
FIG. 2 is a cross sectional view of the first preferred embodiment of the present invention.

A first preferred embodiment of the present invention is shown in FIG. 2. On an insulating GaAs substrate, N+-GaAs layer 2 is formed with a thickness of 1 $\mu$m and an impurity concentration of $2 \times 10^{18}$ cm$^{-3}$. The impurity in the N+-GaAs layer 2 is silicon. An N-GaAs layer 3 is then formed on the N+-GaAs layer 2 with a thickness of 3,000 Å and an impurity concentration of $1 \times 10^{17}$ cm$^{-3}$. The impurity is silicon. The N-GaAs layer 3 is an actual collector region. The N+-GaAs layer 2 is formed for decreasing a collector resistance and for achieving a low-resistance ohmic contact with collector electrodes 7 of an alloy of gold, germanium and nickel. A base region of P+-Ge layer 11 is formed on the N-GaAs layer 3 with a thickness of 1,000 Å and an impurity concentration of $1 \times 10^{19}$ cm$^{-3}$. The P-type impurity in germanium is gallium. On the periphery of the P+-Ge layer 11, a ring-shaped base electrode 9 of an alloy of gold and indium is formed with a cover of an insulator film 8 of SiO$_2$. On the center of the P+-Ge layer 11, an N-type semiconductor layer 12 of a mixed crystal of silicon and germanium is formed with a thickness of 2,000 Å and an impurity concentration of $5 \times 10^{16}$ cm$^{-3}$. The N-type impurity in the mixed semiconductor layer 12 is antimony. The content of silicon in the semiconductor layer 12 is selected from a range of 10 mol. % to 40 mol. %. A preferable content of silicon is 20 mol. %. An N+-Ge layer 13 is formed on the semiconductor layer 12 with a thickness of 3,000 Å and an impurity concentration of $1 \times 10^{20}$ cm$^{-3}$. The N-type impurity in the N-Ge layer 13 is arsenic. An emitter electrode 10 of gold is contacted with the N+-Ge layer 13 and a part of the insulator film 8. The semiconductor layer 12 of the mixed crystal and the N+-Ge layer 13 form an emitter region. The semiconductor layer 12 of the mixed crystal is an actual emitter region. The N+-Ge layer 13 is formed to form a low-resistance ohmic contact with the emitter electrode 10.

Figure 3:
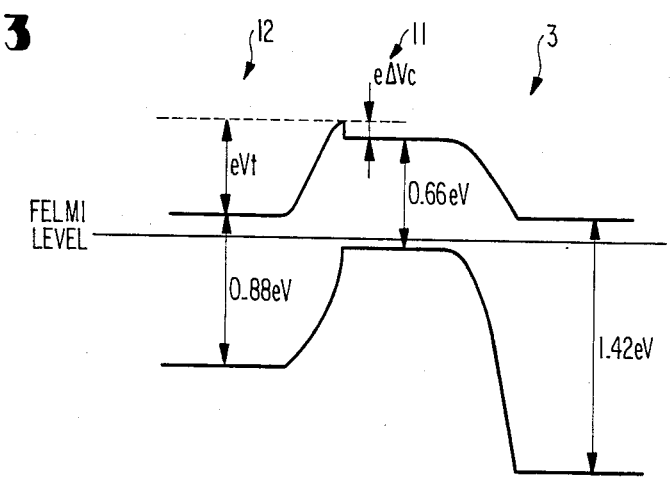
FIG. 3 is a diagram showing an energy band structure of the first preferred embodiment of the present invention.

According to a publication "Heterojunctions and Metal-Semiconductor Junctions" by A. G. Milness and D. L. Feucht, page 9, the semiconductor of a mixed crystal composed of 90 mol. % of Ge and 10 mol. % of Si has an energy band-gap of 0.77 eV. The semiconductor of the mixed crystal having a content of silicon of 10 mol. % to 40 mol. % has an energy band gap equal to or more than 0.77 eV. On the other hand, germanium has an energy band gap of 0.66 eV. Thus, the energy band-gap of the semiconductor layer 12 is larger than the P+-Ge layer 11 to form a wide band-gap transistor. The energy band gap of the N-GaAs layer 3 is 1.42 eV. The energy band structure of the transistor according to the first preferred embodiment is shown in FIG. 3. The energy difference eVt corresponds to a voltage necessary to inject electrons from the emitter region of the semiconductor layer 12 to the base region of the P+-Ge layer 11 and is a total value of a difference between upper edges of the energy band-gaps of the semiconductor layer 12 and the P+-Ge layer 11 and an off-set energy e$\Delta$Vc of the conduction band at the interface between the semiconductor layer 12 and the P+-Ge layer 11. When the transistor is biased, there is no barrier against electrons injected from the semiconductor layer 12 to the P+-Ge layer 11 but remains a barrier against holes in the P+-Ge layer 11. The injection efficiency of minority carriers is not degraded and keeps high value.

Due to the structure of wide band-gap transistor, the impurity concentration of the P+-Ge layer as a base region can be increased without decreasing the minority carrier injection efficiency, so that the base resistance can be made small. In addition, electron mobility in the P+-Ge layer 11 is large. From those facts, the transistor of the first preferred embodiment operates in high speed with a high current gain.

The energy band-gap of the P+-Ge layer 11 is as low as 0.66 eV. Therefore, the transistor of the first preferred embodiment can be driven with a low voltage signal and consumes a low power. Furthermore, the germanium of the P+-Ge layer 11 as the base region is an indirect type semiconductor having a long life-time of minority carrier. Therefore, the transistor of the first preferred embodiment maintains a high injection efficiency of minority carriers to present a high current gain.

All the layers 2, 3, 11, 12 and 13 may be grown by molecular beam epitaxy without interface defects. Especially, the semiconductor layer 12 of the mixed crystal is grown on the P+-Ge layer 11. Because the lattice difference between silicon and germanium is 4%, the usual vapor deposition of the mixed crystal of silicon and germanium on P+-Ge layer accompanies interface defects. However, the interface defects do not appear, when the semiconductor layer 12 of the mixed crystal of silicon and germanium is grown on the P+-Ge layer 11 by the molecular beam epitaxy.

The germanium and the semiconductor of a mixed crystal composed of silicon and germanium have energy band-gap lower than GaAs. A low-resistance ohmic contact between the N+-Ge layer and the emitter electrode 10 of metal is obtained. The good ohmic contact is also obtained between the emitter electrode 10 and the semiconductor layer 12. Therefore, the N+-Ge layer 13 may be removed for simplifying the structure.

Figure 4:
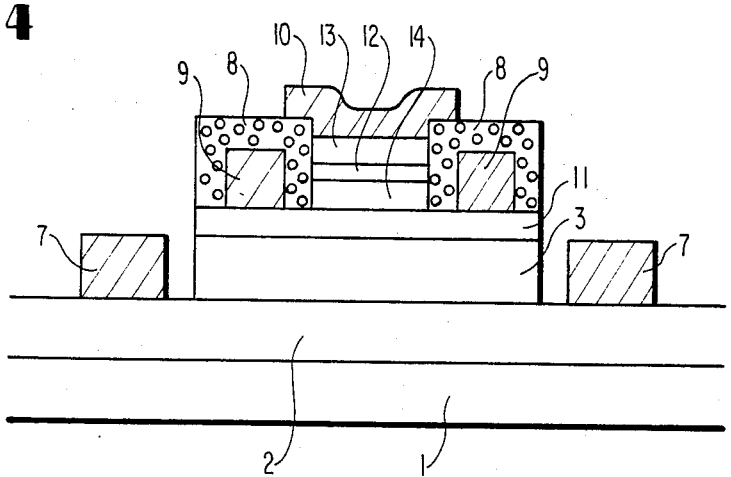
FIG. 4 is a cross sectional view of the second preferred embodiment of the present invention.
Figure 5:
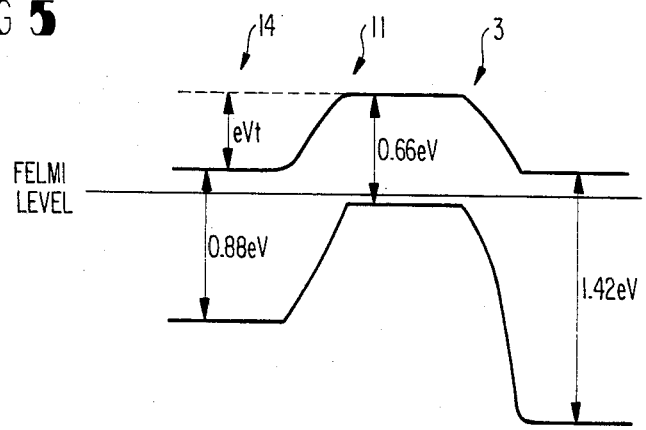
FIG. 5 is a diagram showing an energy band structure of the second preferred embodiment of the present invention.

FIGS. 4 and 5 show a second preferred embodiment of the present invention. On an insulating GaAs substrate 1, the N+-GaAs layer 2 is formed with a thickness of 1 μm and an impurity concentration of $2 \times 10^{18}$ cm$^{-3}$. The collector electrodes 7 of an alloy of gold, germanium and nickel is attached to the N+-GaAs layer 2. The N-GaAs layer 3 having a thickness of 3,000 Å and an impurity concentration of $1 \times 10^{17}$ is formed on the N+-GaAs layer 2 as an actual collector region. The P+-Ge layer 11 having a thickness of 1,000 Å and an impurity concentration of $1 \times 10^{19}$ cm$^{-3}$ is formed on the N-GaAs layer 3 as a base region. The base electrode 9 of an alloy of gold and indium is attached on the peripheral portion of the P+-Ge layer 11 with the cover of insulator film 8 of SiO$_2$. The actual emitter region formed on the P+-Ge layer 11 is an N-type semiconductor layer 14 of a mixed crystal composed of germanium and silicon in which the content of silicon consecutively increases from zero at the interface with the P+-Ge layer 11 to a value selected from a range between 10 mol. % and 40 mol. %. The preferable content of silicon at the upper surface of the semiconductor layer 14 is 20 mol. %. The thickness and the impurity concentration of the semiconductor layer 14 are 1,000 Å and $5 \times 10^{16}$ cm$^{-3}$. The N-type impurity in the semiconductor layer 14 is antimony. The N-type semiconductor layer 12 of a mixed crystal composed of germanium of 80 mol. % and silicon of 20 mol. % is formed on the semiconductor layer 14 with a thickness of 1,000 Å and an impurity concentration of $5 \times 10^{16}$ cm$^{-3}$. The N+-Ge layer 13 is formed on the N-type semiconductor layer 12 with a thickness of 3,000 Å and an impurity concentration of $1 \times 10^{20}$ cm$^{-3}$. The emitter electrode 10 of gold is deposited on the N+-Ge layer 13.

All the layers 2, 3, 11, 14, 12 and 13 may be grown without interface defects by molecular beam epitaxy.

The emitter electrode 10 may form a low-resistance ohmic contact with either the N+-Ge layer 13, the N-type semiconductor layer 12 or the N-type semiconductor layer 14. Therefore, one or two of the N+-Ge layer 13 and N-type semiconductor layer 12 may be removed for simplicity of device structure.

The energy band structure of the second preferred embodiment is shown in FIG. 5. Compared to FIG. 3 of the first preferred embodiment, the offset eΔVc at the interface of base and emitter regions disappear. This disappearance is based on the use of the semiconductor layer 14 of a mixed crystal of germanium and silicon which has a graded content of silicon and which is only germanium at the interface with the P+-Ge layer 11. The voltage necessary for injecting electrons from the semiconductor layer 14 to the P+-Ge layer 11 correspond only the energy difference eVt between the upper edges of the energy band-gaps of the semiconductor layer 11 and the P+-Ge layer 11. The transistor may be driven by the voltage lower than the transistor of the first preferred embodiment and consumes more small power.

The energy band structure shows the transistor is a wide band-gap transistor. Similar to the transistor according to the first preferred embodiment, the transistor of the second preferred embodiment has an improved injection efficiency of minority carriers and improved current gain and is operable at high speed with a simplified structure.

Although some preferred embodiments of the present invention has been explained hereinbefore, many modification may be applied. The insulating GaAs layer may be replaced with other insulating or semi-insulating substrate such as an intrinsic germanium substrate and an intrinsic silicon substrate.

What is claimed is:
1. A heterojunction transistor comprising;
   a collector region having a GaAs layer of one conductivity type;
   a base region having a germanium layer of the other conductivity type formed on said GaAs layer; and
   an emitter region having a mixed crystal layer of silicon and germanium, said mixed crystal layer having said one conductivity type and being formed on said germanium layer.
2. A heterojunction transistor as claimed in claim 1, wherein said mixed crystal layer has silicon of 10 mol. % to 40 mol. % which is uniformly distributed in said mixed crystal layer.
3. A heterojunction transistor as claimed in claim 2, further comprising a high impurity concentration layer of GaAs of said one conductivity type on which said GaAs layer is formed, a high impurity concentration layer of germanium of said one conductivity type formed on said mixed crystal layer, a collector electrode contacted with said high impurity concentration layer of GaAs, a base electrode contacted with said germanium layer, and an emitter electrode contacted with said high impurity concentration layer of germanium.
4. A heterojunction transistor as claimed in claim 2, wherein said one conductivity type is N-type, said other conductivity type being P-type.
5. A heterojunction transistor as claimed in claim 1, wherein said mixed crystal layer is formed in contact with said germanium layer and the content of silicon in said mixed crystal layer is zero at an interface with said germanium layer and is continuously increased with a distance from said interface.

6. A heterojunction transistor as claimed in claim 5, wherein a maximum value of said content of silicon is a value between 10 mol. % and 40 mol. %.

7. A heterojunction transistor as claimed in claim 6, wherein said one conductivity type is N-type, said other conductivity type being P-type.

8. A heterojunction transistor as claimed in claim 6 further comprising a high impurity concentration GaAs layer of said one conductivity type on which said GaAs layer is formed, an additional mixed crystal layer of silicon and germanium of said one conductivity type formed on said mixed crystal layer, said silicon being contained uniformly throughout said additional mixed crystal layer, a high impurity concentration germanium layer of said one conductivity type formed on said additional mixed crystal layer, a collector electrode contacted with said high impurity concentration GaAs layer, a base electrode contacted with said germanium layer and an emitter electrode contacted with said high impurity concentration germanium layer.

9. A heterojunction transistor as claimed in claim 8, wherein said additional mixed crystal layer has silicon of 10 mol. % to 40 mol. %.

10. A heterojunction bipolar transistor comprising;
a GaAs layer of one conductivity type;
a collector electrode coupled to said GaAs layer;
a first germanium layer of the other conductivity type formed in contact with said GaAs layer;
a base electrode coupled to said first germanium layer;
a semiconductor layer of said one conductivity type formed in contact with said first germanium layer, said semiconductor layer being comprised of mixed crystal of silicon and germanium in which silicon is uniformly contained,
a second germanium layer of said one conductivity type formed in contact with said semiconductor layer; and
an emitter electrode coupled to said second germanium layer.

11. A heterojunction bipolar transistor as claimed in claim 10, wherein said one conductivity type is N-type, said other conductivity type being P-type.

12. A heterojunction bipolar transistor comprising;
a GaAs layer of one conductivity type;
a collector electrode coupled to said GaAs layer;
a first germanium layer of the other conductivity type formed in contact with said GaAs layer;
a base electrode coupled to said first germanium layer;
a first semiconductor layer of said one conductivity type formed in contact with said first germanium layer, said first semiconductor layer being comprised of mixed crystal of silicon and germanium in which the content of silicon is zero at an interface with said first germanium layer and is continuously increased with a distance from said interface to a value between 10 mol. % and 40 mol. %;
a second semiconductor layer of said one conductivity type formed in contact with said first semiconductor layer, said second semiconductor layer being comprised of mixed crystal of silicon and germanium and having a uniform content of silicon of 10 mol. % to 40 mol. %;
a second germanium layer of said one conductivity type formed in contact with said second semiconductor layer; and
an emitter electrode coupled to said second germanium layer.

13. A heterojunction bipolar transistor as claimed in claim 12, wherein said one conductivity type is N-type, said other conductivity type being P-type.

* * * * *

UNITED STATES PATENT AND TRADEMARK OFFICE
CERTIFICATE OF CORRECTION

PATENT NO. : 4,716,445

DATED : December 29, 1987

INVENTOR(S) : SONE

It is certified that error appears in the above-identified patent and that said Letters Patent is hereby corrected as shown below:

COLUMN 1, LINE 65  Delete "Ce" and insert --Ge.--

Signed and Sealed this

Twenty-third Day of August, 1988

Attest:

DONALD J. QUIGG

Attesting Officer

Commissioner of Patents and Trademarks